(12) United States Patent
Samson et al.

(10) Patent No.: US 11,237,580 B1
(45) Date of Patent: Feb. 1, 2022

(54) SYSTEMS AND METHODS PROVIDING LEAKAGE REDUCTION FOR POWER GATED DOMAINS

(71) Applicant: QUALCOMM Incorporated, San Diego, CA (US)

(72) Inventors: Giby Samson, San Diego, CA (US); Foua Vang, Sacramento, CA (US); Ramaprasath Vilangudipitchai, San Diego, CA (US); Seung Hyuk Kang, San Diego, CA (US); Venugopal Boynapalli, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/015,486

(22) Filed: Sep. 9, 2020

(51) Int. Cl.
*G05F 1/46* (2006.01)
*H03K 19/00* (2006.01)
*H03K 17/22* (2006.01)

(52) U.S. Cl.
CPC ........... *G05F 1/465* (2013.01); *H03K 17/223* (2013.01); *H03K 19/0016* (2013.01)

(58) Field of Classification Search
None
See application file for complete search history.

(56) References Cited

U.S. PATENT DOCUMENTS

| | | | | |
|---|---|---|---|---|
| 6,031,778 A | * | 2/2000 | Makino | G11C 7/00 365/226 |
| 10,003,325 B2 | * | 6/2018 | Goel | H03K 3/012 |
| 10,103,626 B1 | * | 10/2018 | Narayanan | G06F 1/263 |

OTHER PUBLICATIONS

Pu Y., et al., "A 9-mm² Ultra-Low-Power Highly Integrated 28-nm CMOS SoC for Internet of Things," IEEE Journal of Solid-State Circuits, Mar. 2018, vol. 53, No. 3, pp. 936-948.

* cited by examiner

*Primary Examiner* — Jeffery S Zweizig
(74) *Attorney, Agent, or Firm* — Haynes and Boone, LLP (57) ABSTRACT

A system includes: a first power supply; a second power supply; a headswitch disposed between the first power supply and logic circuitry; an enable driver coupling the second power supply to a control terminal of the headswitch; and a voltage generator operable to adjust a control voltage from the second power supply to the control terminal of the headswitch in response to a first voltage level of the first power supply exceeding a reference voltage level.

21 Claims, 8 Drawing Sheets

SYSTEMS AND METHODS PROVIDING LEAKAGE REDUCTION FOR POWER GATED DOMAINS

TECHNICAL FIELD

The present application relates, generally, to power gated domains and, more specifically, to reducing leakage in power gated switches.

BACKGROUND

A conventional computing device (e.g., smart phone, tablet computer, etc.) may include a system on chip (SOC), which has a processor and other operational circuits. The SOC may receive its power from a battery, and thus conventional designs may balance SOC performance and power usage to deliver a desirable experience to the user while requiring as little battery charging as practicable.

Power gating is a technique that may be used to save power in some instances. One way in which some systems may use power gating to save power is to enable a power collapse of some parts of a processing core (using a first power multiplexor and a first power domain) while providing power to other parts of the processing core (using a second power multiplexor and a second power domain). Another way in which some conventional systems may use power gating is to switch from a first power supply to a second power supply to power a central processing unit (CPU) memory and then adjusting the second power supply to overdrive the CPU memory. This technique may save power by allowing the SOC to selectively raise a voltage at some components while not raising the voltage at other components. Of course, power gating may also include simply collapsing power at one or more components that are not in use and then restoring power at a later time.

Some power gating circuits may use headswitches or foot switches, each having a transistor. The transistor may be turned off to power collapse the corresponding part of the processing core or other processing logic. However, even if a transistor is turned off, it may still allow some leakage current. For instance, with a P-channel Metal Oxide Semiconductor (PMOS) headswitch, it is turned off when its gate-source voltage is greater than or equal to zero. Real-world PMOS headswitches are not ideal switches, and leakage current may flow even in the off state. The leakage may translate to power drawn from an always-on power supply, thereby manifesting itself in reduced battery life. Accordingly, there is a need for circuits and techniques to reduce leakage.

SUMMARY

Various implementations provide circuits and techniques to reduce leakage in power gating switches. In one example implementation, a PMOS headswitch is kept in a super-cut off state when it is off. The super-cut off state may include providing a positive gate-source voltage to the transistor, at least in some voltage ranges. Further in this example, when the source voltage passes a threshold, the system may adjust the gate-source voltage to be approximately zero, so that the transistor is held in an off state, though not in super-cut off.

According to one implementation, a system includes: a first power supply; a second power supply; a headswitch disposed between the first power supply and logic circuitry; an enable driver coupling the second power supply to a control terminal of the headswitch; and a voltage generator operable to adjust a control voltage from the second power supply to the control terminal of the headswitch in response to a first voltage level of the first power supply exceeding a reference voltage level.

According to another implementation, a method includes: enabling a headswitch to conduct a current from a first power supply to logic circuitry; and turning off the current by disabling the headswitch, including: selecting a first voltage level, from among the first voltage level and a second voltage level, in response to comparing the first voltage level and the second voltage level; and applying the first voltage level from a second power supply to a gate of the headswitch.

According to another implementation, a circuit including: a first power rail coupled to a first power supply; a second power rail coupled to a second power supply; a power gating switch coupled between the first power rail and a portion of logic circuitry of a central processing unit (CPU); and means for selecting a control voltage from the second power rail to a control terminal of the power gating switch in response to a first voltage level of the first power supply being below a reference voltage level.

DETAILED DESCRIPTION

Various implementations provided herein include systems and methods to provide power gating for logic circuits with decreased leakage compared to other implementations. One example includes a first power supply, which is coupled to a source of a transistor. A second power supply is coupled to the control terminal (e.g., the gate) of the transistor. The transistor itself, which may include a headswitch, is disposed between the first power supply and logic circuitry (e.g., the drain of the transistor may be coupled to the logic circuitry). An enable driver, such as a buffer with an inverter, may couple the second power supply to the gate of the transistor.

Continuing with the example, the system may further include a voltage generator which is operable to adjust a control voltage from the second power supply to the control terminal of the transistor. The voltage generator adjusts the control voltage in response to a voltage level of the first power supply exceeding a reference voltage level. The reference voltage level may be set at any appropriate value, which may be chosen by trial and error, simulation, or the like. In this example implementation, the reference voltage level is set so that the level of the control voltage reduces or avoids gate induced drain leakage (GIDL).

Therefore, in this example, during an off state of the transistor the transistor may be held in a super-cut off state in which the gate voltage is higher than the source voltage. However, the transistor may have an operating area in which a positive gate-source voltage achieved above a particular gate voltage level may actually increase leakage rather than decrease leakage. This increased leakage is referred to as GIDL. Maintaining a positive gate-source voltage during an off state of the transistor may not be effective if the source voltage varies and may reach a level that would otherwise dictate a gate voltage that would cause GIDL.

In one example, the proposed system and method reduce or eliminate GIDL by providing a voltage generator that adjusts the control voltage from the second power supply to the gate of the transistor. When the source voltage from the first power supply exceeds a reference voltage level, then the voltage generator may adjust the control voltage from the second power supply so that it is approximately equal to the source voltage.

In other words, when the source voltage from the first power supply exceeds the reference voltage level, the voltage generator may then adjust the control voltage so that the gate-source voltage is zero or approximately zero. As discussed above, a gate-source voltage of zero may still incur leakage, but the system may be designed so that the leakage due to a gate-source voltage being zero is less than the leakage that would have been experienced due to GIDL.

In one example, the voltage generator includes a comparator having a first input coupled to the first power supply and a second input coupled to the reference voltage. The voltage generator may also include circuitry operable to adjust the control voltage between a first voltage level (of the first power supply) and a second voltage level (the reference voltage level) in response to an output of the comparator. For instance, if the voltage level of the first power supply surpasses the reference voltage level, then the voltage generator may output the voltage level of the first power supply as the control voltage. On the other hand, if the voltage level of the first power supply is below that of the reference voltage level, then the voltage generator may output the reference voltage level as the control voltage.

Various implementations may also include methods. An example method includes enabling a headswitch to conduct a current from a first power supply to logic circuitry. When the headswitch is in an on state and conducts the current to the logic circuitry, the logic circuitry is not power collapsed. The method may further include turning off the current by disabling the headswitch, thereby power collapsing the logic circuitry. Turning off the current may include selecting a first voltage level from among a first voltage level and a second voltage level in response to comparing the first voltage level and the second voltage level. For instance, the first voltage level may include the source voltage, and the second voltage level may include a reference voltage, so that the method includes selecting either the source voltage or the reference voltage to apply as a control voltage to a gate of the transistor.

Various implementations may include advantages over other systems. One advantage includes reducing leakage by applying a super-cut off state to a power gating switch. The super-cut off state may reduce leakage beyond that which could otherwise be achieved by simply turning the power gating switch off. Furthermore, the circuits described herein may use less silicon area to achieve the super-cut off state than other alternatives. Specifically, some implementations described herein may provide for the voltage selection using an operational amplifier (op amp) and a plurality of transistors, which has less overhead than would have previously been considered for other leakage reducing alternatives.

Figure 1:
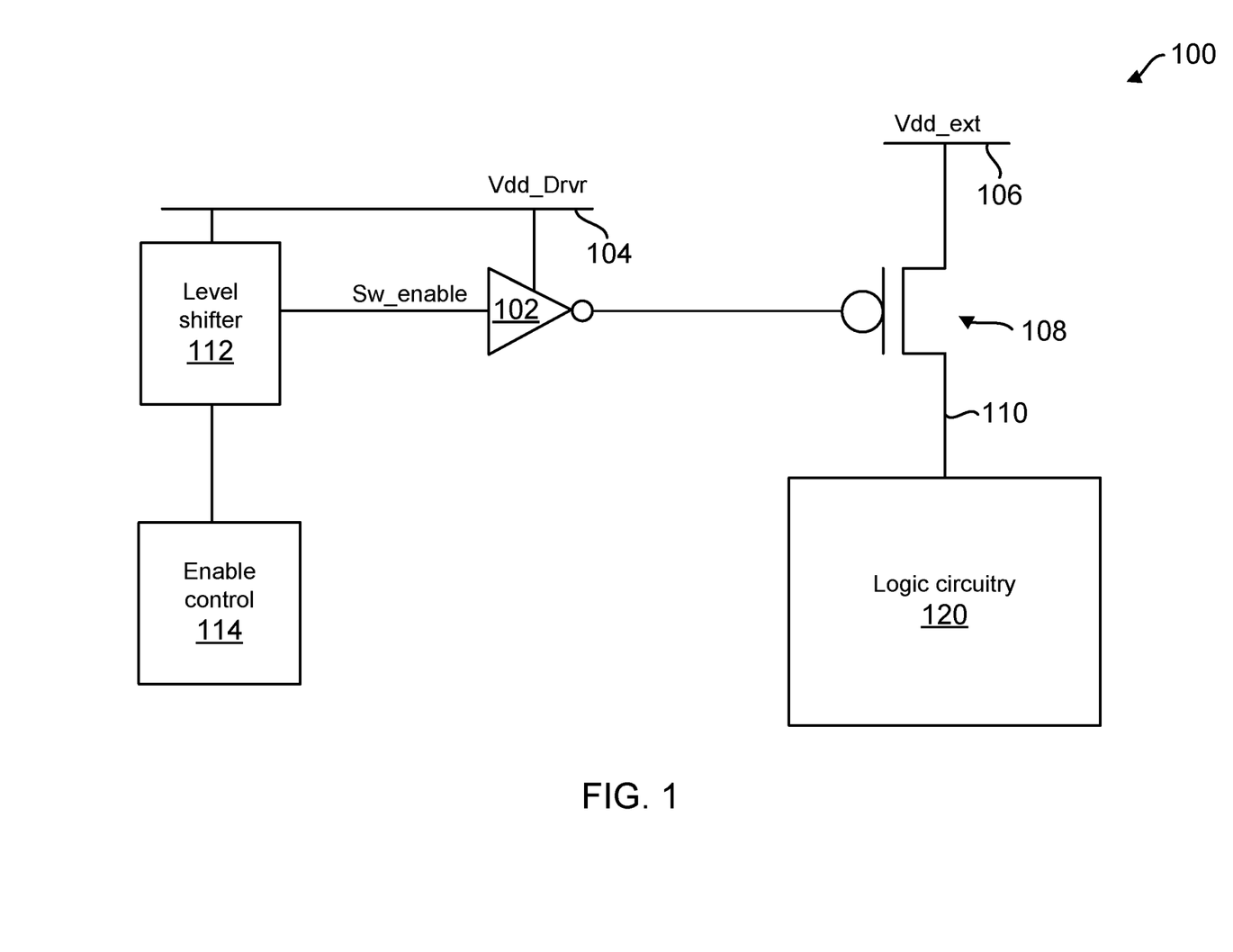
FIG. 1 is a simplified diagram illustrating an example system for power gating logic circuitry, according to one implementation.

FIG. 1 is a simplified diagram illustrating an example system 100 for power gating logic circuitry 120, according to one implementation. Example system 100 includes an enable driver 102, which provides a control voltage to the control terminal (gate) of headswitch 108. Headswitch 108 in this example includes a P-channel Metal Oxide Semiconductor (PMOS) transistor that is disposed between a first power supply (Vdd_ext) and logic circuitry 120. Specifically, the source of headswitch 108 is coupled to power supply 106, which supplies power to logic circuitry 120 when headswitch 108 is on. The drain of headswitch 108 is coupled to power gated supply rail 110, which supplies power to logic circuitry 120.

Headswitch 108 behaves such that when its gate-source voltage is greater than or equal to zero, headswitch 108 turns off, thereby power collapsing logic circuitry 120. Similarly, when its gate-source voltage is negative, headswitch 108 turns on, thereby supplying power from power rail 106 to logic circuitry 120.

Enable driver 102 is coupled to second power supply 104 (Vdd_Drvr). Enable driver 102 is also coupled to level shifter 112 and enable control circuitry 114. When enable signal (Sw_enable) is high, the enable driver 102 drives a zero to the gate of headswitch 108, thereby turning on headswitch 108. When the enable signal is low, the enable driver drives a logic one to the gate of headswitch 108, thereby turning off headswitch 108. Level shifter 112 outputs the enable signal at a same voltage as the second power supply 104 (Vdd_Drvr). Enable control circuitry 114 determines whether the enable signal is high or low and may be in communication with other components, such as an adaptive power program running in a kernel of an operating system of a central processing unit (CPU) core that may or may not include logic circuitry 120.

As noted above, the enable signal is at a same voltage as the second power supply 104, and the enable driver 102 outputs a voltage the same as that received on power rail coupled to power supply 104. Thus, when the headswitch 108 is off, the enable signal goes to zero, which passes Vdd_Drvr (a digital 1) to the gate of the headswitch 108. Now the voltage difference between the gate and the source (the gate-source voltage) is Vdd_Drvr minus Vdd_ext. As noted below, various implementations may vary Vdd_Drvr so that it may be higher than Vdd_ext to put the PMOS transistor of the headswitch 108 in a super-cut off state.

Figure 2:
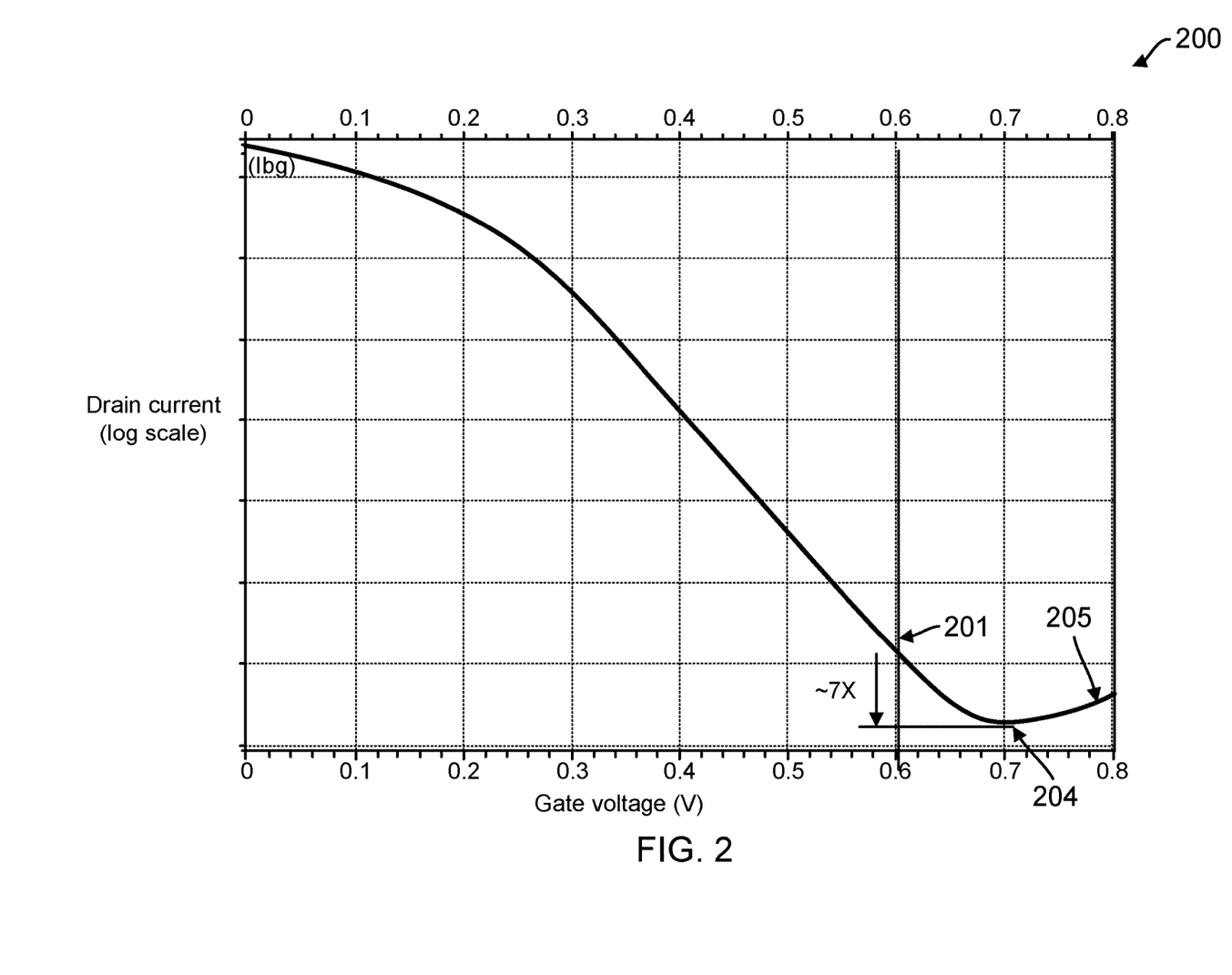
FIG. 2 is a graph showing an example relationship between drain current of a headswitch and gate voltage of the headswitch of FIG. 1, according to one implementation.

Reference is now made to FIG. 2, which is a graph showing an example relationship between drain current of headswitch 108 (on the Y axis) and gate voltage of the headswitch 108 (on the x-axis). The graph of FIG. 2 assumes that the voltage Vdd_ext at the first power supply 106 is equal to 0.6 V. It should be noted though that the various voltages discussed herein are for example only, and other applications may use different voltages for the gate or source of headswitch 108 as appropriate for the particular transistor used for headswitch 108.

The drain current is mostly high and positive until the gate voltage equals the source voltage or, in other words, the gate-source voltage is equal to zero. This is illustrated at 201. However, when the gate-source voltage is equal to zero, the current at the drain is not quite zero. Rather, the drain current may be further reduced as shown at point 204, where the gate voltage is 0.7 V. The part of graph 200 in which the gate-source voltage is positive is referred to as a super-cut off state of the transistor. The current at point 201 is approximately seven times the current at point 204, thereby illustrating that the super-cut off state may further reduce leakage current in the system of FIG. 1. Further, it should be noted that as the gate voltage increases past point 205 (gate voltage at approximately 0.8 V), then GIDL increases, thereby offsetting some or all of the gains from putting the transistor in a super-cut off state. Accordingly, various implementations described herein may adjust the control voltage from the second power supply 104 to the control terminal of the headswitch 108 to achieve a super-cut off state of the transistor while also avoiding GIDL. This is described in more detail below.

Figure 3:
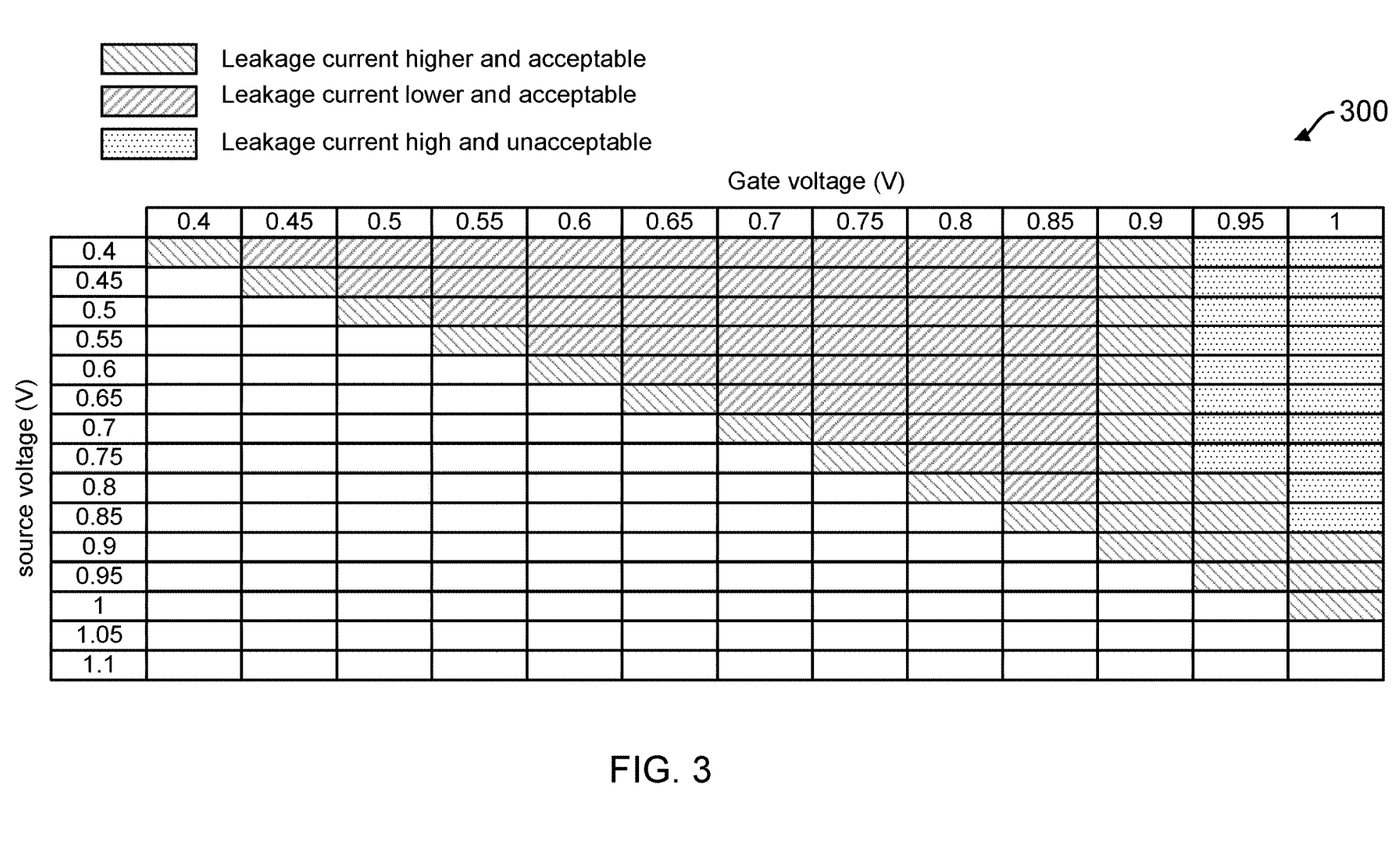
FIG. 3 is a graph showing an example relationship between gate voltage and source voltage, according to the implementation of FIG. 2.

The concepts of super-cut off state and GIDL are further illustrated in FIG. 3. FIG. 3 is a graph showing an example relationship between gate voltage and source voltage, according to the implementation of FIG. 2. Furthermore, FIG. 3 illustrates different levels of leakage current during an off state or super-cut off state of a transistor, such as the transistor of headswitch 108 of FIG. 1. There are three different levels of leakage current illustrated—low and acceptable, higher but acceptable, and high and unacceptable. Of course, these labels are for example only, as are the particular gate and source voltages. Other implementations may use different voltages and have different tolerance for leakage current such that the difference between acceptable and unacceptable may be moved up or down for other implementations.

In FIG. 3, a gate voltage above about 0.9 V provides an unacceptable amounts of leakage current in this example, and the leakage current increases as the gate voltage increases. By contrast, a gate voltage below about 0.9 V is within an acceptable range, and the amount of leakage current decreases as the gate voltage decreases. The bottom bound of the graph of FIG. 3 is when the gate-source voltage is zero, which in this example is indicated as higher but acceptable.

Looking at the examples of FIG. 1 and FIG. 3, various implementations may prevent leakage by maintaining headswitch 108 in a super-cut off state. However, if the first power supply (Vdd_ext) varies, then the level of Vdd_ext may rise to a point where a gate voltage (Vdd_Drvr) that is high enough to maintain the headswitch 108 in a super-cut off state would cause an unacceptable level of leakage current. Accordingly, some implementations of the system of FIG. 1 may adjust the control voltage Vdd_Drvr so that it maintains the headswitch 108 in a super-cut off state for some Vdd_ext levels, but should Vdd_ext surpass a threshold, then the system may cause the control voltage Vdd_Drvr to equal Vdd_ext so that the gate-source voltage is zero and leakage current is still within an acceptable range.

Figure 4:
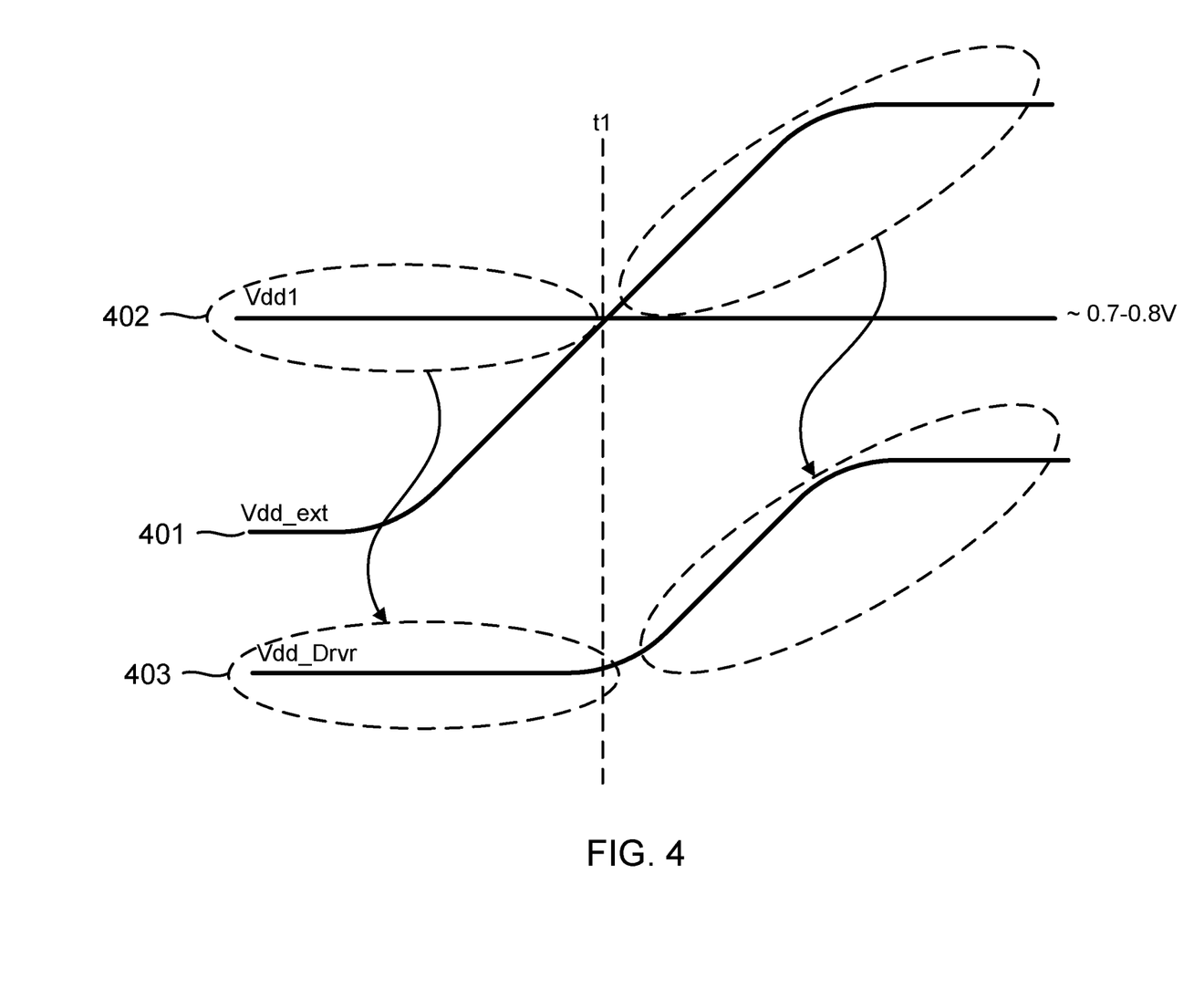
FIG. 4 is an illustration of various voltage levels for use in the implementation of FIG. 1.

Therefore, an example implementation includes selecting a reference voltage, such as that shown as Vdd1 in FIG. 4. The reference voltage Vdd1 is selected at a level above which the gate voltage would be expected to experience unacceptable GIDL. Of course, this differs with each application, as some applications may be more tolerant to GIDL or leakage in general. The example of FIG. 4 is directed to the relationship shown in FIG. 3, showing some levels of acceptable leakage in other levels of unacceptable leakage. Specifically, the level of reference voltage Vdd1 is set between 0.7 V and 0.8 V, which corresponds to a gate voltage with an acceptable level of leakage in the FIG. 3 example. In some implementations, the specific level of Vdd1 is not set with a high level of precision, but rather is set based on experimentation or simulation and may be set within a range in which the gate voltage results in an acceptable level of leakage. Thus, the example of FIG. 3 may also be served by a reference voltage level of Vdd1 that is as high as 0.85 V.

Curve 401 shows a time-varying level of Vdd_ext, which is associated with the first power supply 106 of FIG. 1. Curve 402 shows the reference voltage level Vdd1, which is set at a level between 0.7 V and 0.8 V. Curve 403 shows the level of Vdd_Drvr, which is associated with the second power supply 104, as it changes over time in reaction to the change in the level of Vdd_ext. FIG. 4 shows curve 403 shifted vertically down with respect to curve 401 for ease of illustration, and that is not intended to show an absolute voltage level of Vdd_Drvr.

Before time T1, Vdd_ext is below a voltage level of Vdd1. So in an instance in which logic circuitry 120 of FIG. 1 is power collapsed, then the system of FIG. 1 maintains the headswitch 108 in a super-cut off state by applying the control voltage Vdd_Drvr equal to Vdd1. This is indicated by the ovals on the left-hand side around Vdd1 and Vdd_Drvr. Once again, Vdd_ext is associated with the first power supply 106 and is the source voltage. Therefore, before time T1, the gate-source voltage is positive.

At time T1, Vdd_ext is equal to the reference voltage Vdd1. As mentioned above, Vdd_ext may be a time-varying voltage so the system uses a dynamic setting for Vdd_Drvr. After time T1, if the control voltage Vdd_Drvr was left at the value of Vdd1, then the gate-source voltage would be negative, thereby turning on the headswitch 108. Accordingly, to maintain the headswitch 108 in an off state, the system causes Vdd_Drvr to be equal to Vdd_ext, thereby causing a gate-source voltage of zero and keeping the headswitch 108 in an off state.

Moreover, maintaining a super-cut off state of headswitch 108 after time T1 would be expected to cause unacceptable leakage due to GIDL, because the gate voltage would be above 0.7 V-0.8 V, as described above with respect to FIG. 3. Therefore, the system uses a gate-source voltage of zero after time T1 to keep the headswitch 108 in an off state and with an acceptable amount of leakage.

Figure 5:
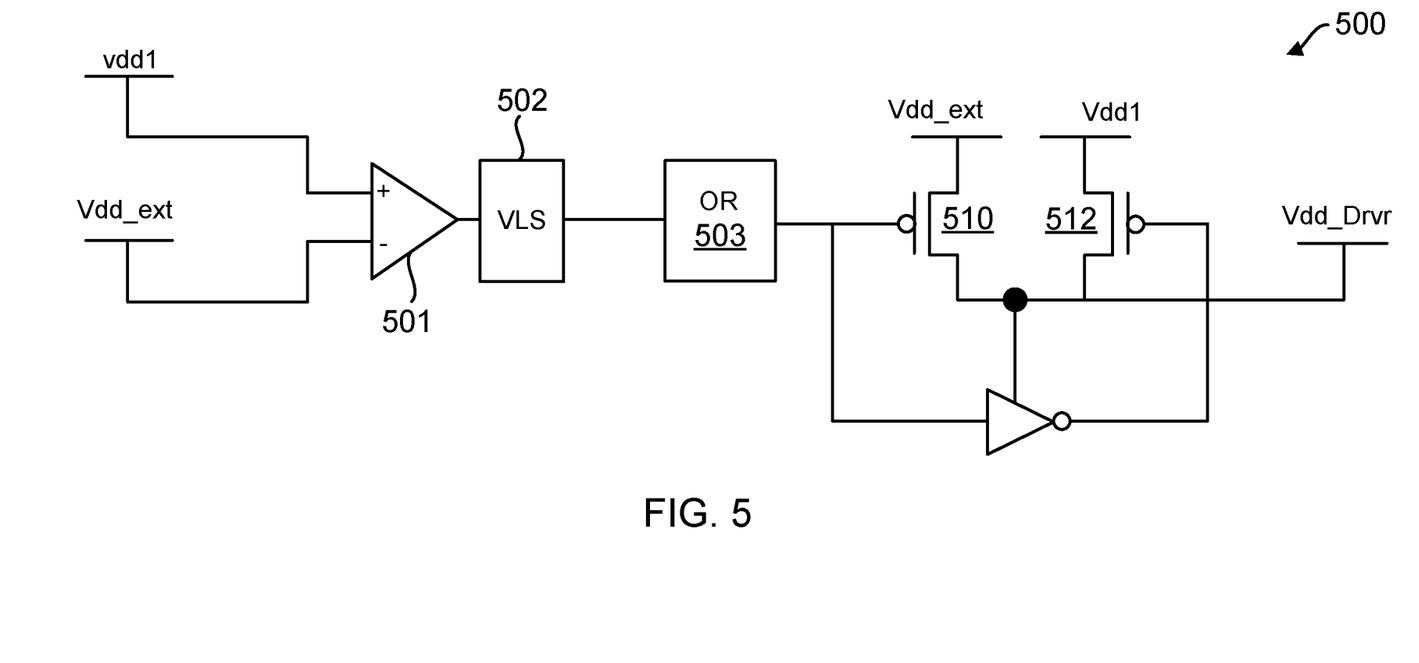
FIG. 5 is an illustration of example voltage generator, adapted according to one implementation.

FIG. 5 is an illustration of example voltage generator 500, adapted according to one implementation. Voltage generator 500 is operable to adjust the control voltage Vdd_Drvr from the second power supply 104 to the control terminal of the headswitch 108 in response to the voltage level of Vdd_ext exceeding the reference voltage level Vdd1. In short, when Vdd1 is higher than Vdd_ext, then voltage generator 500 selects Vdd1 and passes it to Vdd_Drvr. When Vdd1 is lower than Vdd_ext, then voltage generator selects Vdd_ext and passes it to Vdd_Drvr. According to one implementation, the output of voltage generator 500 may be coupled to the power rail associated with power supply 104.

Voltage generator 500 includes comparator 501 (e.g., an operational amplifier or op amp) that receives the reference voltage Vdd1 at its + input and receives the voltage Vdd_ext from the first power supply 106 at its inverting input. The output of comparator 501 is either a digital one or a digital zero, which is converted by voltage level shifter 502 into a voltage domain compatible with transistors 510 and 512. When Vdd1 is higher than Vdd_ext, then the comparator outputs a digital one, and the digital one causes PMOS transistor 510 to turn off and PMOS transistor 512 to turn on, thereby causing Vdd1 to appear at Vdd_Drvr.

When Vdd_ext is higher than Vdd1, that causes a digital zero to appear at the output of the comparator 501. This turns on PMOS 510 and turns off PMOS 512, thereby causing Vdd_ext to appear at Vdd_Drvr. This causes the selection of one voltage level (Vdd_ext) versus another voltage level (Vdd1) to be output as Vdd_Drvr. As noted above, during design of the system, Vdd1 is selected to be set at a level either at or below where experimentation or simulation indicates that GIDL would occur. Therefore, voltage generator 500 causes Vdd_Drvr to follow the example of FIG. 4, thereby reducing an amount of leakage during an off state of headswitch 108 by either keeping the transistor of headswitch 108 in a super-cut off state or a state where the gate-source voltage is zero (at least when headswitch 108 is off).

Continuing with the example of FIG. 5, it also includes an override mechanism 503 in line between the voltage level shifter 502 and the transistors 510, 512. In this example, the override mechanism 503 is operable to force the voltage generator 500 to output Vdd_Drvr at a voltage equal to Vdd_ext. In some examples, when the override mechanism 503 overrides the output of comparator 501, the comparator 501 and the voltage level shifter 502 may be turned-off. There may be some instances in which it may be more desirable to have a gate-source voltage of zero than to vary the gate-source voltage. For instance, there may be a sleep mode in which Vdd_ext may be zero, and it would generally be more desirable to make the gate voltage Vdd_Drvr zero as well to place the chip into a deep sleep. In some examples, the override mechanism 503 can be implemented with software. Of course, the scope of implementations is not limited to using the software override in any particular scenario. The override mechanism 503 may include logic circuitry having a programmed software control register or may include a logic block that combines multiple inputs that indicate the state of the system 100 at a particular point in time. In one implementation, the override mechanism 503 may include logic circuitry to generate enable signals for the transistors 510, 512 based on output from comparator 501 and a state of an override signal (not shown) from another source within system 100. Such logic circuitry can be referred to as override circuitry.

Figure 6:
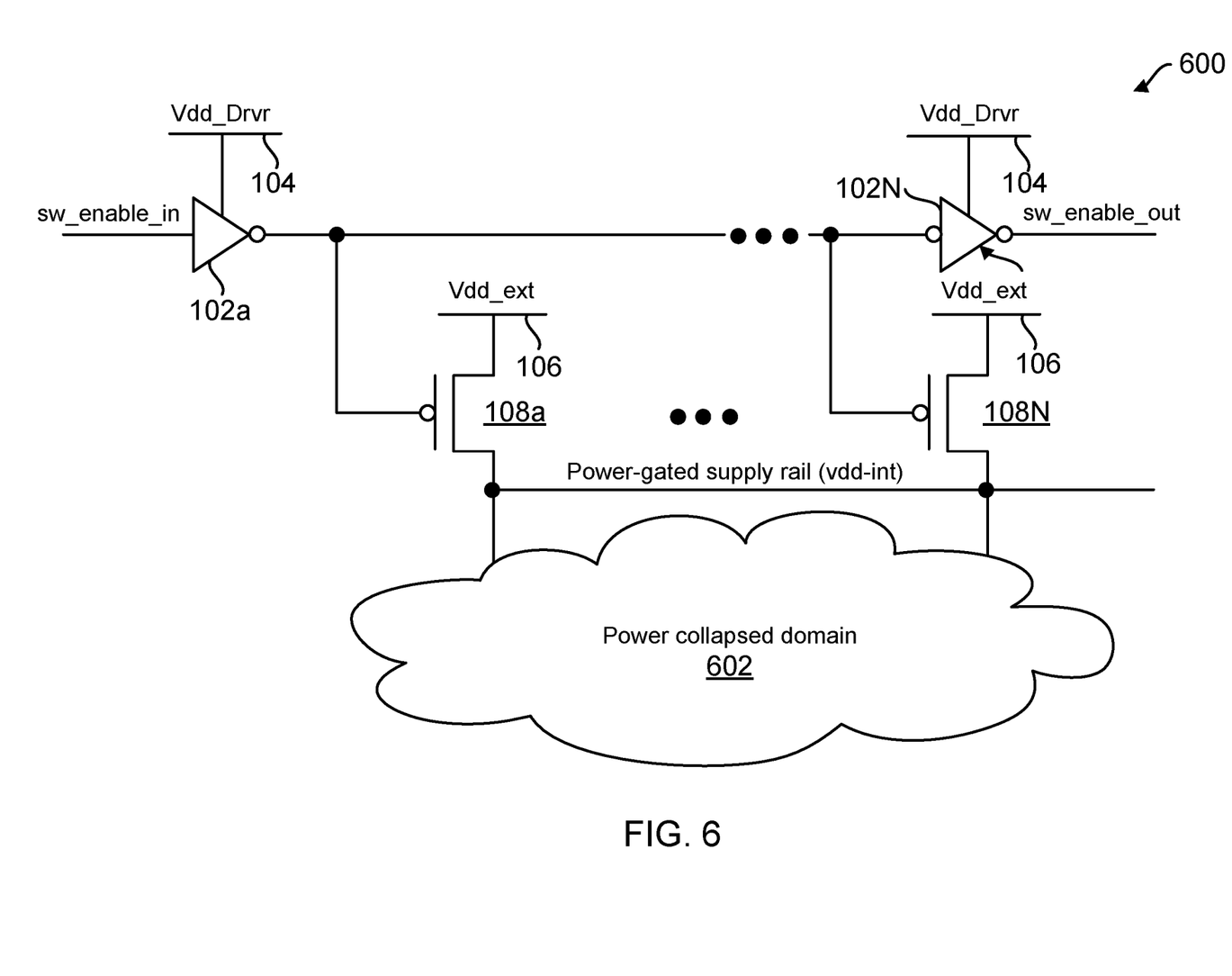
FIG. 6 is a simplified diagram, showing that the system of FIG. 1 may be repeated to power collapse multiple portions of logic, according to one implementation.

FIG. 6 is an illustration of example system 600, according to one implementation. FIG. 6 is a simplified diagram, showing that the system of FIG. 1 may be repeated to power collapse multiple portions of logic. For instance, system 600 includes enable drivers 102a through 102N, where N is an integer greater than one. In fact, N can be any appropriate integer. Each of the enable drivers 102 is coupled to the second power supply 104.

Example system 600 also includes multiple headswitches 108a through 108N, where once again N is an integer greater than one. In this example, there are N enable drivers 102 and N headswitches 108, though in other implementations, each enable driver 102 may drive multiple headswitches 108, depending on the sizes of the enable drivers 102 and the sizes of the headswitches 108. Furthermore, the headswitches 108 may be drain-coupled, as illustrated in FIG. 600, though in other implementations the drains may be uncoupled.

Power collapsed domain 602 may include multiple portions of logic circuitry (e.g., multiple instances of logic circuitry 120). The various portions of logic circuitry may be homogeneous or heterogeneous, and the numbers of portions of logic circuitry may be any appropriate number. For instance, system 600 may be used to power collapse an entire domain or a part of a domain, as appropriate.

It is understood that FIG. 6 omits some features for ease of illustration. For instance, whereas FIG. 1 illustrates level shifter 112 and enable control 114, it is understood that the same or similar features may be implemented in system 600 of FIG. 6 by level shifting the software enable signal to be equal to Vdd_Drvr, and the software enable signal may be controlled to be either high or low by enable control circuitry 114.

The circuits in FIG. 6 operate according to the principles described above. For instance, Vdd_Drvr may be supplied by a generator, such as illustrated in FIG. 5. Therefore, the Vdd_Drvr voltage may be selected based on the voltage (Vdd_ext) at the sources of the headswitches 108. Thus, when the headswitches 108 are put in an off state, they may be maintained in a super-cut off state or in a zero gate-source voltage state, depending on the level of Vdd_ext relative to a reference voltage. When the domain 602 is not power collapsed, then the headswitches 108 are on, thereby supplying power from the first power supply 106 to the domain 602 via their respective drains. Logic, such as enable control 114, may power collapse the domain 602 or provide power to the domain 602 based on any criteria and any power algorithm.

Figure 7:
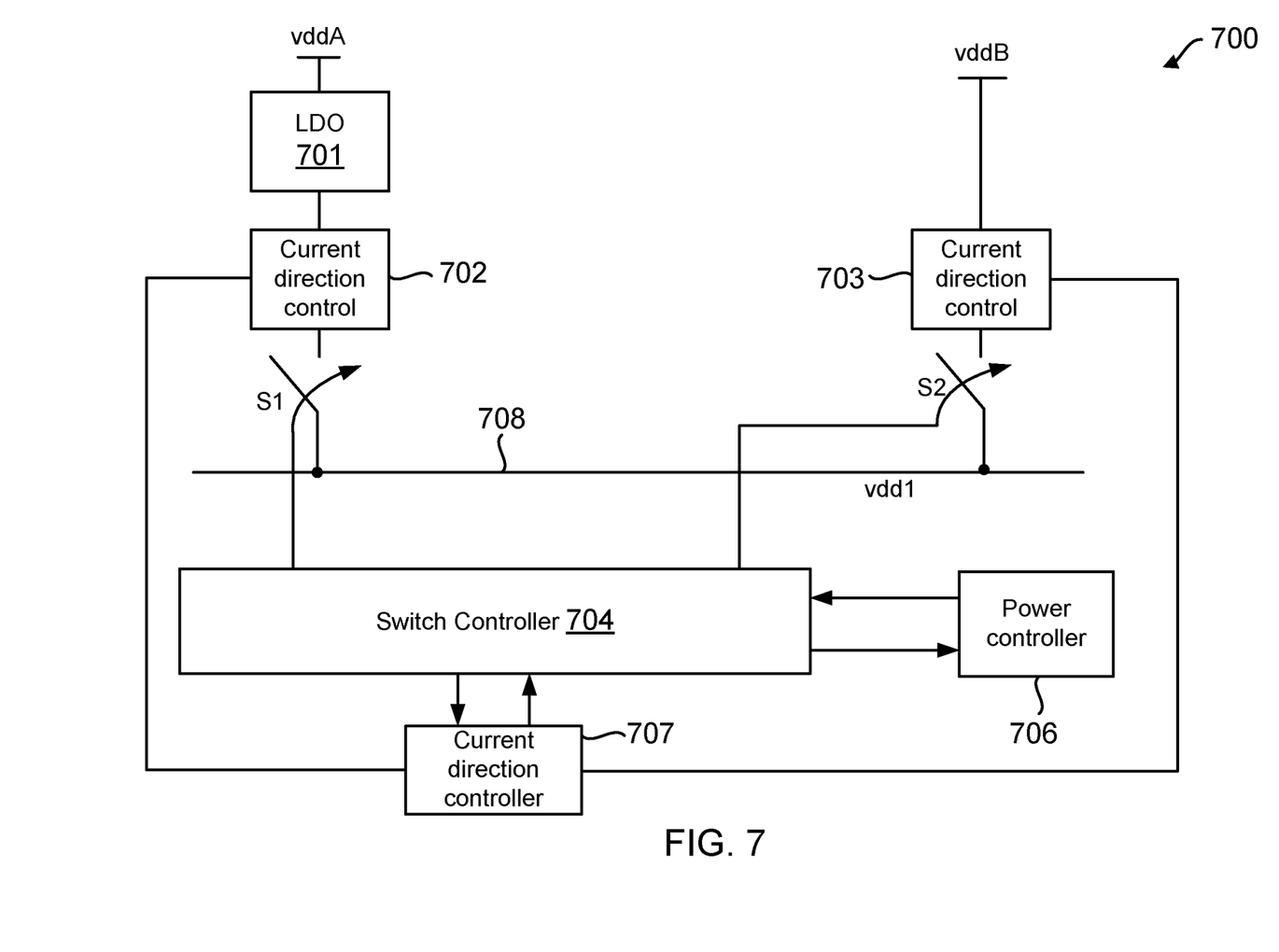
FIG. 7 is an illustration of a reference voltage circuit for generating the reference voltage, according to one implementation.

FIG. 7 is an illustration of a reference voltage circuit 700 for generating the reference voltage Vdd1, according to one implementation. The example of FIG. 7 assumes that an appropriate level for Vdd1 is 07.V to 0.8V, and as noted above, various implementations may use different voltage levels for the gate or source of the headswitches. Therefore, other implementations may use different levels for the reference voltage Vdd1, and it is understood that the particular architecture shown in FIG. 7 may be adapted to generate any appropriate reference voltage level. Furthermore, the voltage levels for the power supplies VddA and VddB are exemplary only, and it is understood that other implementations may have different voltage levels available and may be adapted to use those voltage levels to output an appropriate reference voltage level.

The switches S1 and S2 may be implemented as PMOS switches, N-channel Metal Oxide Semiconductor (NMOS) switches, or any other transistor technology. VddA in this example is a high voltage rail, such as 1.8 V. The low dropout (LDO) voltage regulator 701 may include a resistive drop that lowers the voltage to 0.7V-0.8 V. When switch S1 is closed, it puts the voltage from LDO 701 onto the rail 708 to generate Vdd1. VddB represents another supply voltage that is available at 0.7-0.8 V. However, it might not be available at all times and, thus, the circuit 700 uses both VddA and VddB to provide a reliable Vdd1 at various times and operating modes. For instance, VddB may be intermittently available, such as if it is a variable voltage that may be below a desirable range or exceed a desirable range, then it may not be usable. When VddB is available, circuit 700 may turn on switch S2 to put VddB onto the power rail 708 to generate Vdd1.

In this example, the switches S1 and S2 are complementary so that one is ever open at a time and only one is ever closed at a time, at least when circuit 700 is powered on. The current direction control boxes 702, 703 ensure that current does not flow backwards from VddB to VddA (or vice versa) when switching from one power rail to another. The switches S1 and S2 in practice are not ideal, so even though the switches S1, S2 are complementary, there is a chance that there may be current from one rail to another, which would generally be undesirable.

The current direction control boxes 702, 703 may be as simple as diodes (or more complex), and they reduce or prevent backward current flow from one rail to another. Current direction controller 707 switches the current direction control boxes 702, 703 on or off to save power when not in use.

Power controller 706 is a master controller that understands the levels of VddA and VddB and controls the switches S1 and S2 based on a state of the different voltage levels. For instance, if VddB is unavailable, then power controller 706 may send a signal to switch controller 704 to turn S1 on and turn S2 off. On the other hand, if VddB is available at a desired level for Vdd_Drvr, then power controller 706 may send a signal to switch controller 704 to turn S2 on and turn S1 off.

Various implementations may include one or more advantages over other systems. For instance, some systems may put headswitches into an off state using a zero gate-source voltage for the full duration of the off state. However, the systems may still experience undesired leakage, as explained above, because the zero gate-source voltage state may not be as effective as a super-cut off state. By contrast, implementations described herein may use a super-cut off state when appropriate, thereby experiencing less leakage, at least at some voltages.

Furthermore, the implementations described herein may go from a super-cut off state to a zero gate-source voltage state when the zero-voltage state would be expected to cause less leakage than the super-cut off state. Thus, various implementations may experience less total leakage than other systems, thereby increasing battery life. Furthermore, various implementations described herein may provide for decreased leakage with relatively little increased silicon area.

Various implementations described herein may be suitable for use in a system on chip (SOC). An example of a SOC includes a semiconductor chip having multiple processing devices within it, including a graphics processing unit (GPU), a central processing unit (CPU), a modem unit, a camera unit, and the like. In some examples, the SOC may be included within a chip package, mounted on a printed circuit board, and disposed within a portable device, such as a smart phone or tablet computer. However, the scope of implementations is not limited to a chip implemented within a tablet computer or smart phone, as other applications are possible.

The SOC may include a CPU having multiple cores, and one or more of those cores may execute computer-readable code providing the functionality of an operating system kernel. Furthermore, the example operating system kernel may include power management software that may power down portions of logic on the SOC when those portions are not being used and may power up those portions of logic on the SOC in anticipation of them being used. Accordingly, the principles described above with respect to FIGS. 1-7 may be implemented in an SOC and, more specifically, the circuits shown in FIGS. 1 and 5-7 may be implemented in an SOC to provide power collapsing functionality.

For instance, in a multi-core CPU, some of the cores may not be in use at a given time, and power management software may cause those unused cores to be power collapsed. Continuing with the example herein, a given core may be served by one or more headswitches, such as described above with respect to FIGS. 1 and 6. The power management software may cause the headswitches to turn off to provide power collapse and to turn on in anticipation of use.

A given core may be served by a single headswitch (as in FIG. 1) or may have multiple parts that are served by multiple headswitches (as in FIG. 6). Of course, the scope of implementations is not limited to power collapsing cores of a CPU, as other logic circuits in the SOC may be power collapsed as well, such as cameras, modems, GPU, and the like.

Figure 8:
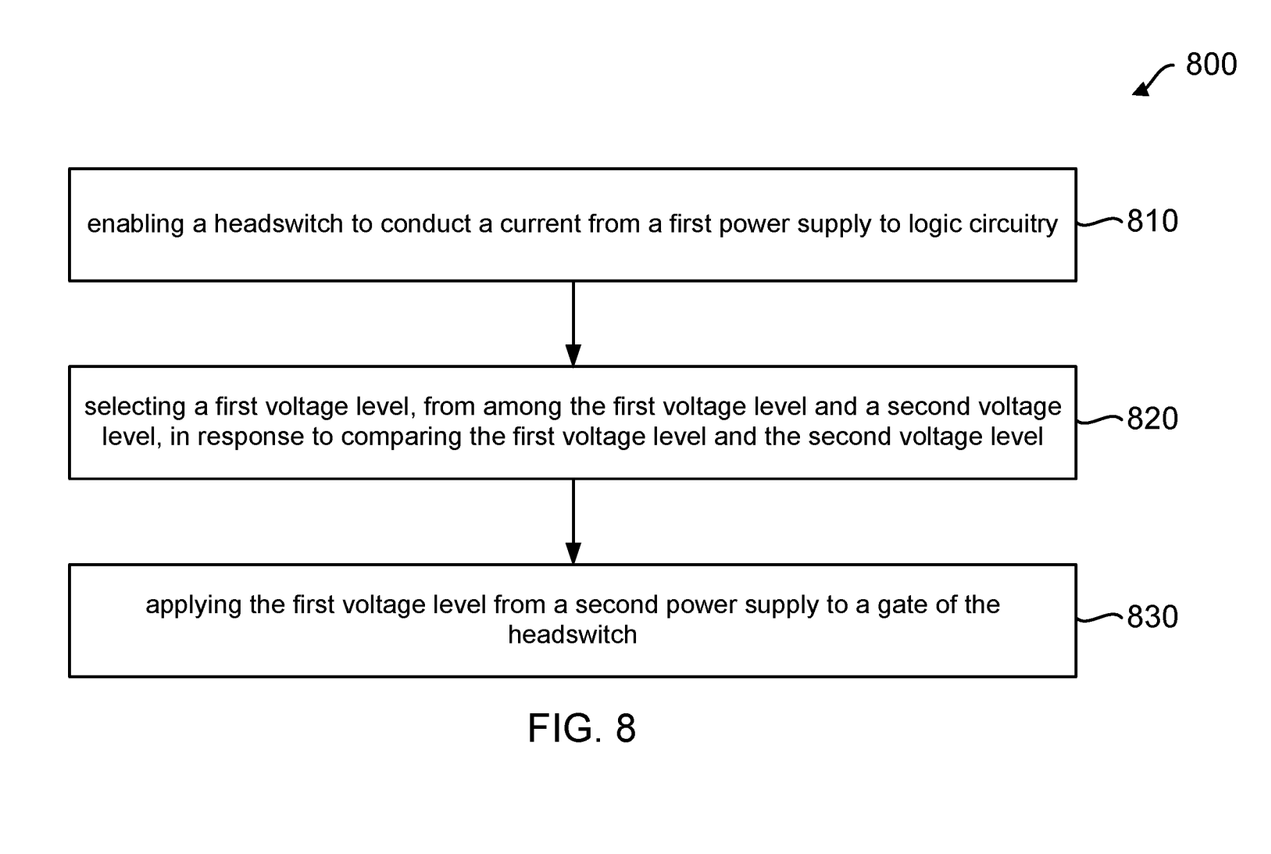
FIG. 8 is an illustration of a method of multiplexing between multiple power supplies, according to one implementation.

A flow diagram of an example method 800 of multiplexing between multiple power supplies is illustrated in FIG. 8. In one example, method 800 is performed by the circuits shown in FIGS. 1 and 5-7. The circuits may operate under control of a power management unit, which may include hardware and/or software functionality at a processor (e.g., CPU) of a computing device served by the circuits of FIGS. 1 and 5-7. In some examples, a power management unit includes processing circuitry that executes computer readable instructions to power up logic circuitry or power collapse logic circuitry.

At action 810, a headswitch is enabled to conduct a current from a first power supply to logic circuitry. An example is shown in FIG. 1, where headswitch 108 may provide a current from the first power supply 106 through its drain to the logic circuitry 120. Continuing with the example, the current is provided at the voltage of Vdd_ext. The headswitch 108 in the example is enabled by applying a logic 0 to its control terminal (its gate), which may include a negative gate-source voltage.

Actions 820 and 830 illustrate turning off the current by disabling the headswitch. For instance, action 820 includes selecting a first voltage level from among the first voltage level and a second voltage level. An example is given at FIG. 5, where the voltage generator for Vdd_Drvr selects between the reference voltage Vdd1 and the source voltage Vdd_ext.

In the example of FIG. 5, the comparator 501 compares Vdd1 and Vdd_ext. If Vdd1 is at a level above Vdd_ext, then the voltage generator 500 selects Vdd1 to output as Vdd_Drvr. On the other hand, if Vdd_ext is higher than Vdd1, then the voltage generator 500 selects Vdd_ext (the source voltage) to output as Vdd_Drvr.

Further in this example, Vdd1 is a reference voltage that is set at a level above which the gate voltage would be expected to experience undesirable GIDL. Accordingly, the voltage generator 500 causes Vdd_Drvr to be equal to Vdd_ext so that the gate-source voltage is zero if GIDL would otherwise cause leakage. On the other hand, at gate voltages below which GIDL would be undesirable, voltage generator 500 applies Vdd1 as Vdd_Drvr, thereby maintaining the headswitch in a super-cut off state, which would be expected to cause less leakage than a state in which the gate-source voltage is zero.

At action 530, the circuit applies the first voltage level from a second power supply to the gate of the headswitch. Continuing with the example, the circuit of FIG. 5 causes either Vdd1 or Vdd_ext to be applied by the second power supply (Vdd_Drvr) to the gate of the headswitch.

The scope of implementations is not limited to the specific actions shown in FIG. 8. Rather, other implementations may add, omit, rearrange, or modify one or more the actions. In one example, an implementation may switch between powering on the logic circuit as in action 810 and powering down the logic as in actions 820, 830 multiple times during normal operation of a computing device. For instance, when the logic circuit is being used to execute code, then the logic circuit may be powered on, whereas when the logic circuit would otherwise be idle, it may be powered down.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A system comprising:
   a first power supply;
   a second power supply;
   a headswitch disposed between the first power supply and logic circuitry;
   an enable driver coupling the second power supply to a control terminal of the headswitch; and
   a voltage generator operable to adjust a control voltage from the second power supply to the control terminal of the headswitch in response to a first voltage level of the first power supply exceeding a reference voltage level.

2. The system of claim 1, further comprising:
   override circuitry coupled to the voltage generator and operable to force the voltage generator to the first voltage level.

3. The system of claim 1, wherein the first power supply comprises a power rail.

4. The system of claim 1, wherein a source terminal of the headswitch is coupled to the first power supply.

5. The system of claim 1, wherein the voltage generator comprises:
   a comparator having a first input coupled to the first power supply and a second input coupled to a reference voltage circuit generating the reference voltage level;
   a first transistor coupled to a first power rail at the reference voltage level, the first transistor being gate-coupled to an output of the comparator through an inverter; and
   a second transistor coupled to the first power supply, the second transistor being gate-coupled to an output of the comparator.

6. The system of claim 5, wherein the reference voltage circuit comprises:
   a first switch coupled to a first reference voltage source;
   a second switch coupled to a second reference voltage source; and
   a switch controller operable to select between the first reference voltage source and the second reference voltage source.

7. The system of claim 5, wherein the headswitch comprises a positive channel metal oxide semiconductor (PMOS) transistor having a drain coupled to the logic circuitry, and wherein the control terminal comprises a gate of the PMOS transistor.

8. A method comprising:
   enabling a headswitch to conduct a current from a first power supply to logic circuitry; and
   turning off the current by disabling the headswitch, including:
   selecting a control voltage, from among a first voltage level and a second voltage level, in response to comparing the first voltage level and the second voltage level; and
   applying the control voltage from a second power supply to a gate of the headswitch.

9. The method of claim 8, wherein applying the control voltage comprises maintaining the headswitch in a super-cut off state.

10. The method of claim 8, wherein applying the control voltage comprises maintaining the headswitch in an off state with a gate-source voltage of zero.

11. The method of claim 8, wherein selecting the control voltage is in response to the first voltage level being higher than the second voltage level, wherein the first voltage level corresponds to a reference voltage.

12. The method of claim 8, wherein selecting the control voltage is in response to the first voltage level being higher than the second voltage level, further, wherein the first voltage level corresponds to a time-varying power rail voltage, and the second voltage level corresponds to a reference voltage.

13. The method of claim 8, wherein turning off the current comprises receiving an enable signal at a buffer, wherein the enable signal is at a same voltage level as the control voltage.

14. A circuit comprising:
   a first power rail coupled to a first power supply;
   a second power rail coupled to a second power supply;
   a power gating switch coupled between the first power rail and a portion of logic circuitry of a central processing unit (CPU); and
   means for selecting a control voltage from the second power rail to a control terminal of the power gating switch in response to a first voltage level of the first power supply being below a reference voltage level.

15. The circuit of claim 14, further comprising means for applying the control voltage to the control terminal in response to an enable signal.

16. The circuit of claim 15, wherein the means for applying the control voltage comprises an inverting buffer configured to receive the enable signal, wherein the enable signal is at a same voltage level as the reference voltage level.

17. The circuit of claim 14, wherein the power gating switch comprises a positive channel metal oxide semiconductor (PMOS) transistor headswitch.

18. The circuit of claim 14, wherein the selecting means comprise:
   a comparator having a first input coupled to the first power rail and a second input coupled to means for generating the reference voltage level; and
   means for adjusting the control voltage between the first voltage level and the reference voltage level in response to an output of the comparator.

19. The circuit of claim 18, wherein the means for generating the reference voltage level comprises:
   a first switch coupled to a first reference voltage source;
   a second switch coupled to a second reference voltage source; and
   means for selecting between the first reference voltage source and the second reference voltage source to apply to the second input.

20. The circuit of claim 14, further comprising:
   override circuitry coupled to the selecting means and operable to force the selecting means to the first voltage level.

21. The circuit of claim 14, wherein the selecting means comprises means for applying the control voltage at the reference voltage level from the second power rail.

* * * * *